United States Patent [19]

Chisholm

[11] 4,340,092

[45] Jul. 20, 1982

[54] METHODS OF AND APPARATUS FOR STRAIGHTENING BACKPLANE-SUPPORTED PINS

[75] Inventor: William M. Chisholm, Midlothian, Va.

[73] Assignee: Western Electric Co., Inc., New York, N.Y.

[21] Appl. No.: 124,662

[22] Filed: Feb. 26, 1980

[51] Int. Cl.³ .............................................. B21F 1/02
[52] U.S. Cl. .................................. 140/147; 140/93 R
[58] Field of Search ............... 140/147, 93 R; 29/755, 29/882

[56] References Cited

U.S. PATENT DOCUMENTS

| | | | |
|---|---|---|---|
| 3,603,357 | 9/1971 | Drummond | 140/147 |
| 3,700,011 | 10/1972 | Walter | 140/147 |
| 3,730,234 | 5/1973 | Hesselmann | 140/147 |
| 3,742,987 | 7/1973 | Tarbox et al. | 140/147 |
| 3,779,291 | 12/1973 | Yeo | 140/147 |
| 3,903,937 | 9/1975 | Drummond | 140/147 |

Primary Examiner—Eugene F. Desmond
Attorney, Agent, or Firm—J. B. Hoofnagle

[57] ABSTRACT

A backplane (32) supporting a plurality of pins (31) is clamped to a fixture (86) which is mounted on a movable platform (48). A pin straightening assembly (85) is attached to a movable holding bar (73) above the backplane-supported pins (31). By selective vertical movement of the straightening assembly (85), tips of the pins (31) are captured therein. The assembly (85) is then reciprocated horizontally in the plane of the assembly to straighten the pins (31) in a first plane. The tips of the pins (31) are then captured by other portions of the assembly (85). The platform (48) is reciprocated horizontally in the plane thereof to straighten the pins (31) in a second plane.

25 Claims, 24 Drawing Figures

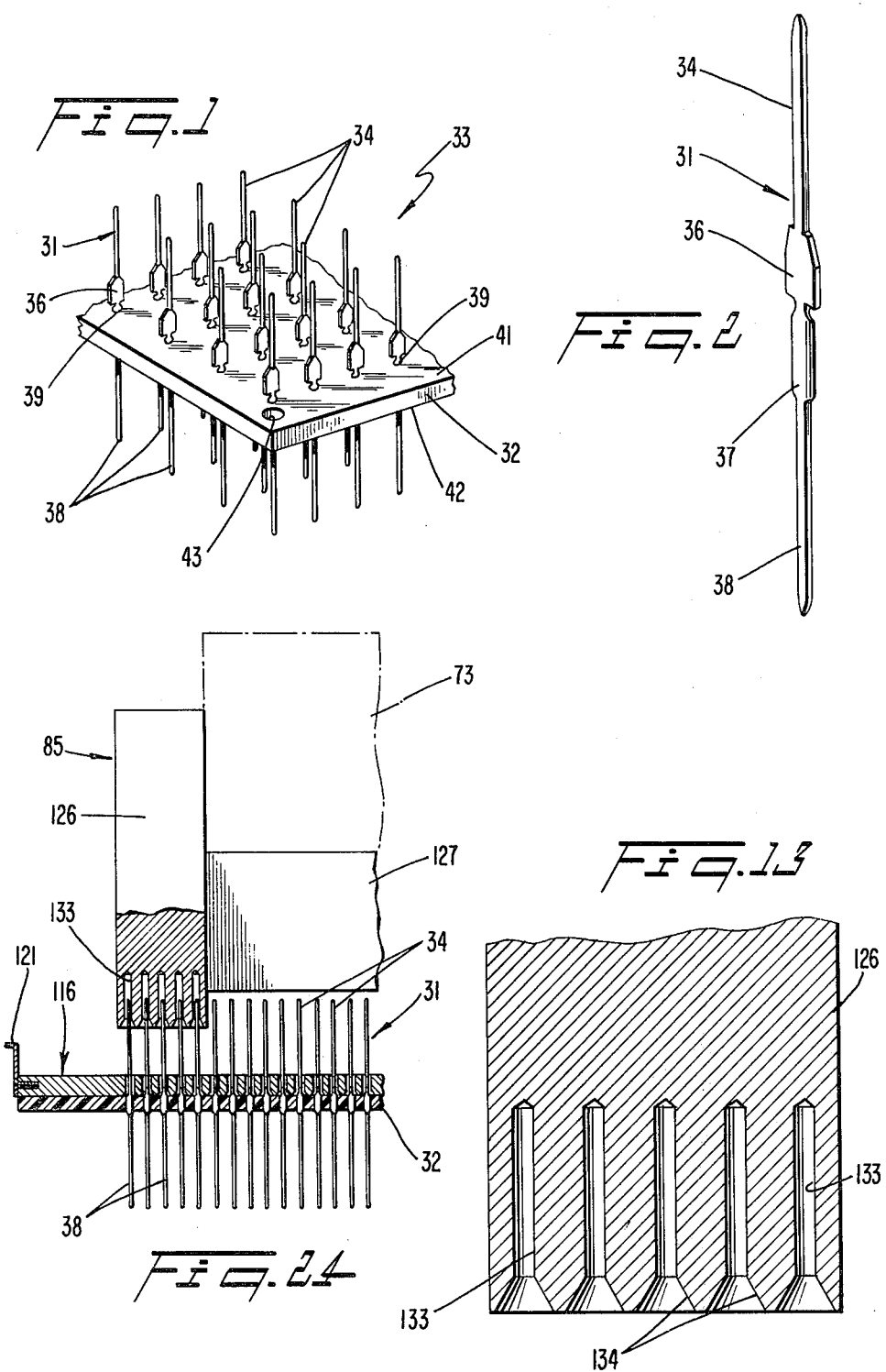

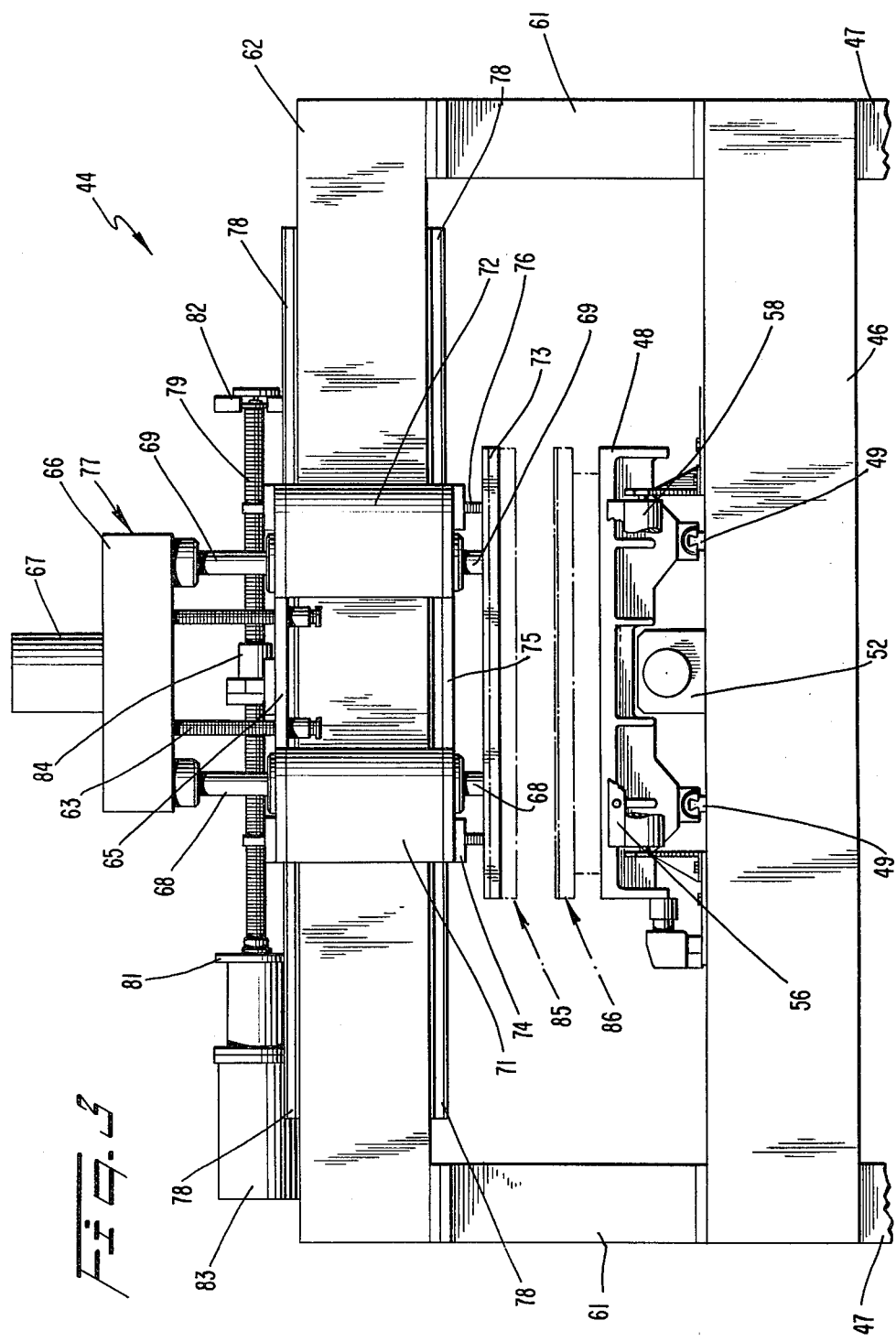

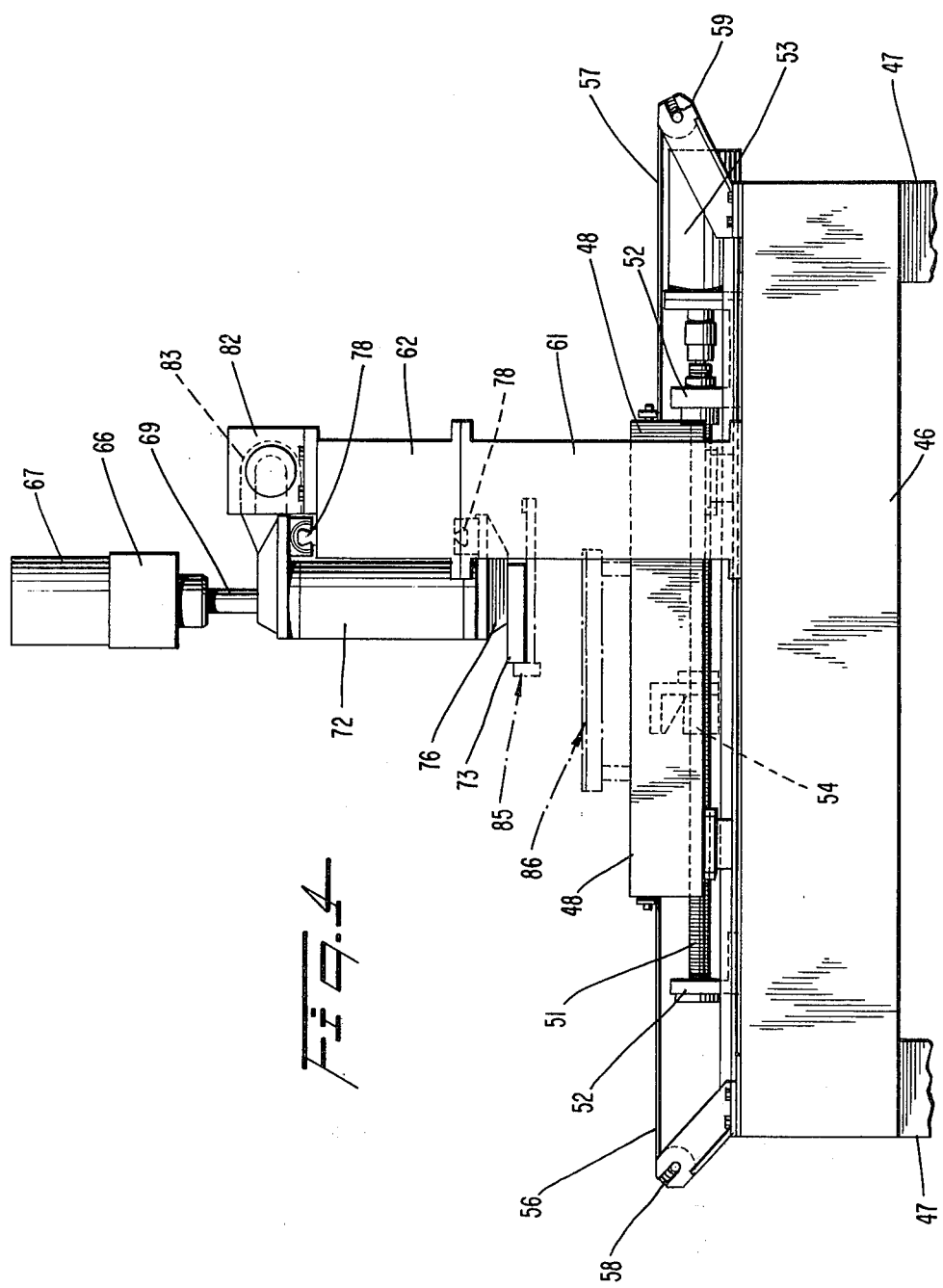

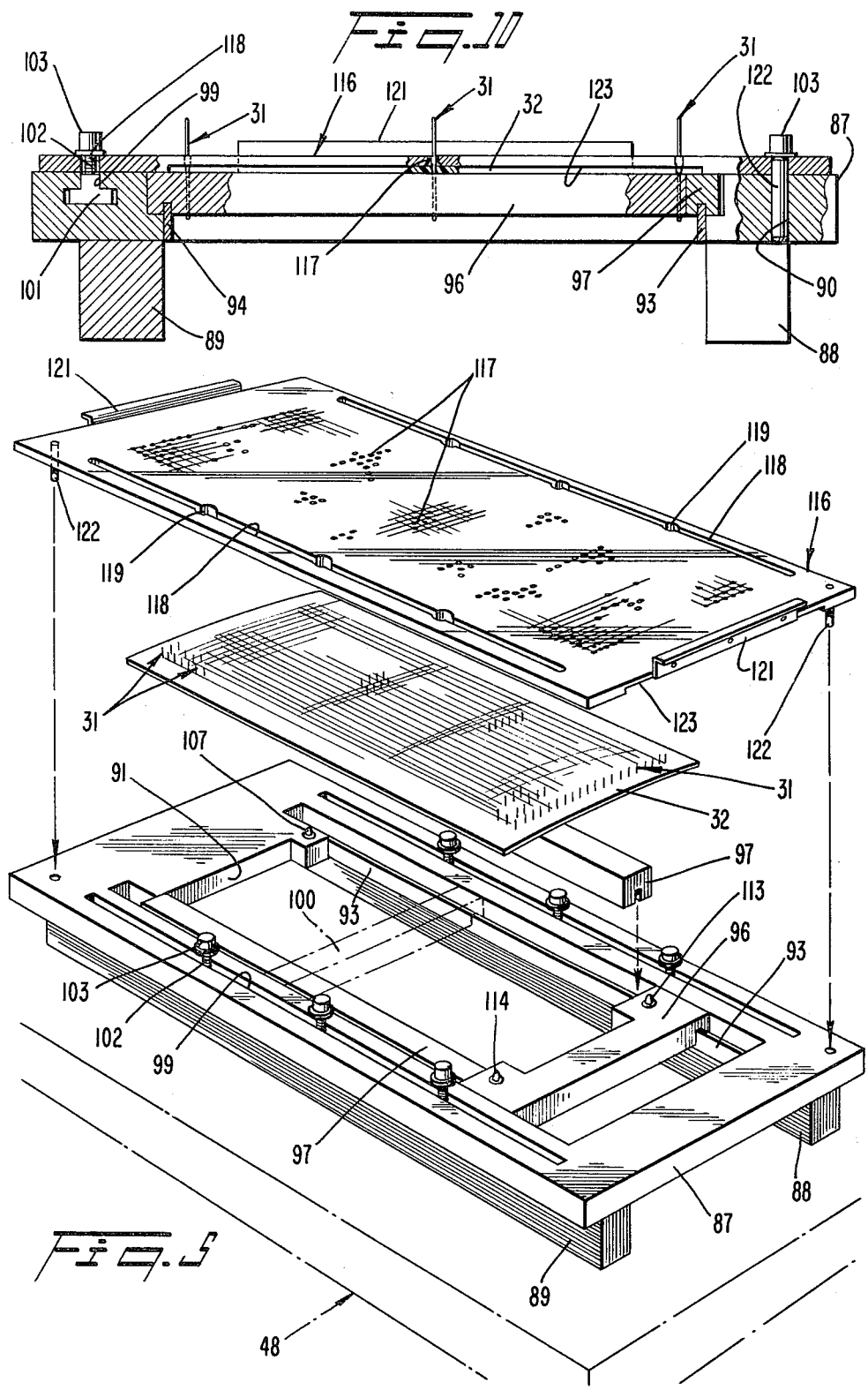

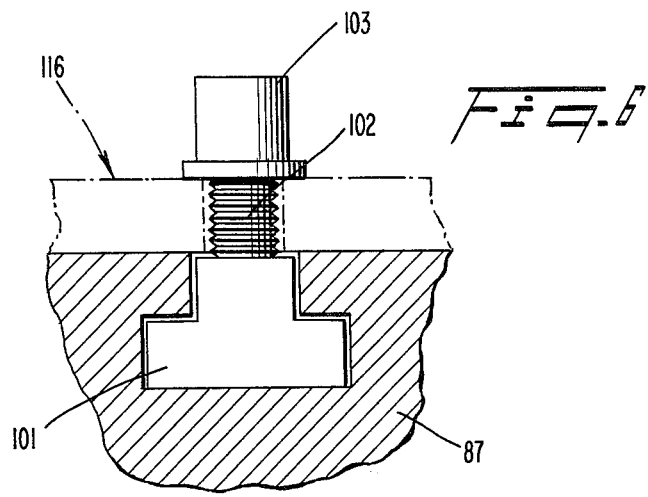
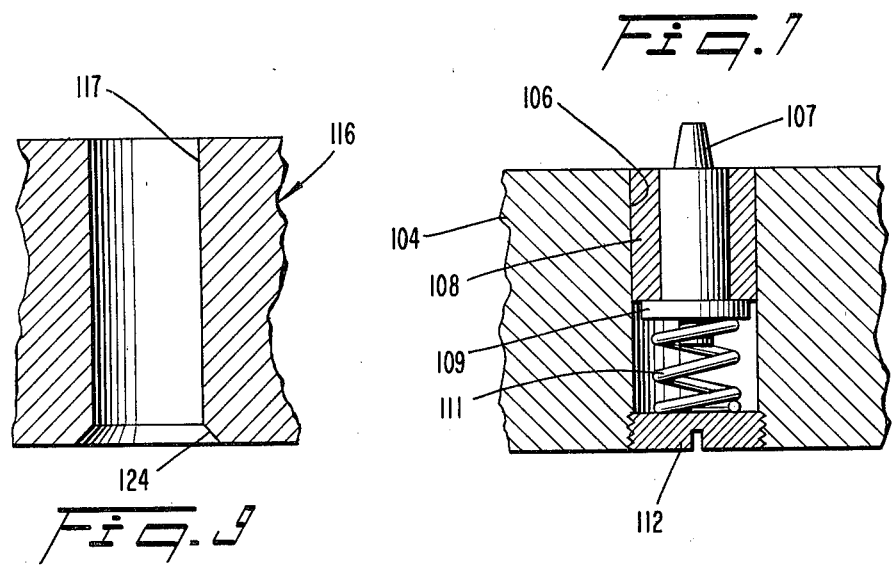
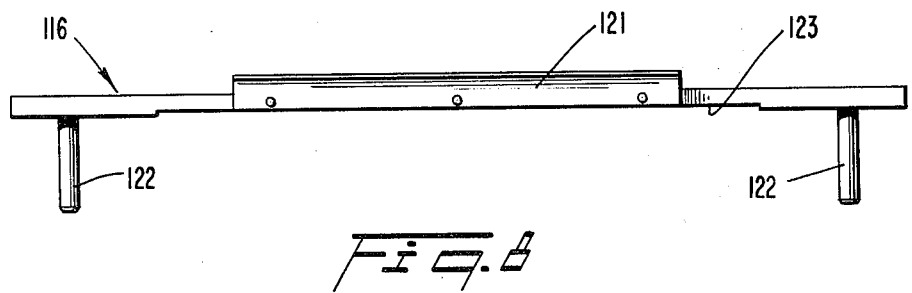

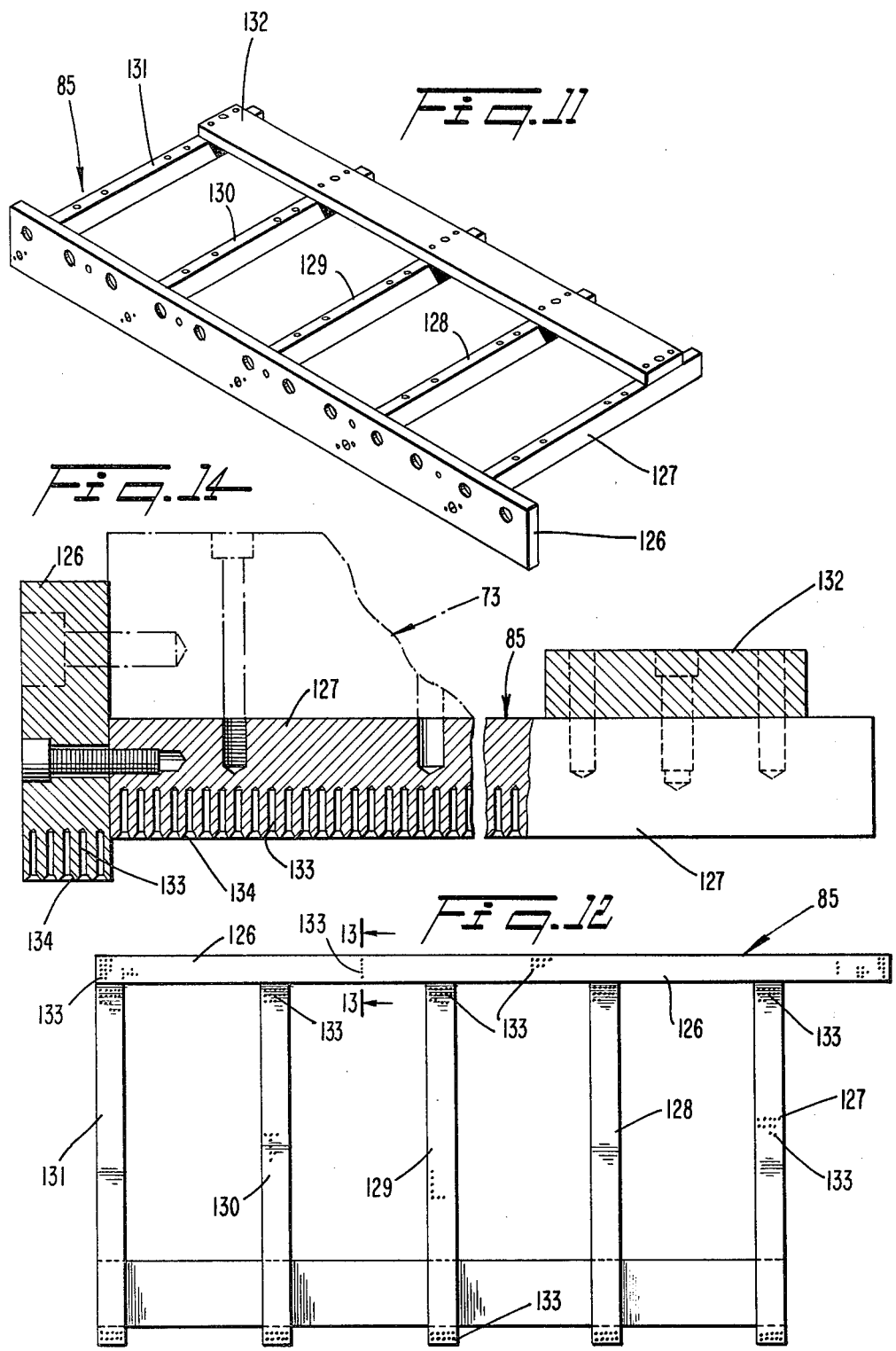

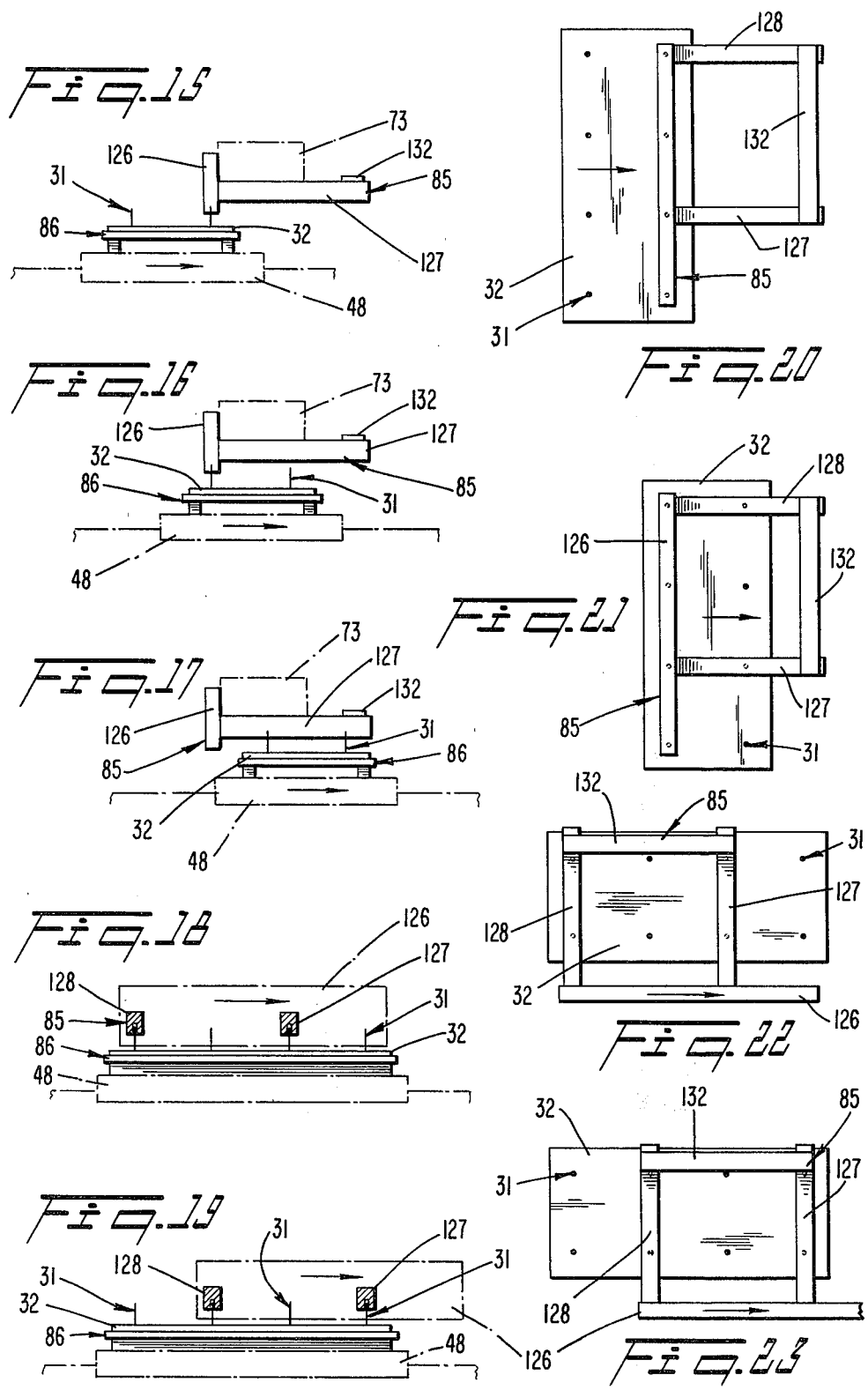

METHODS OF AND APPARATUS FOR STRAIGHTENING BACKPLANE-SUPPORTED PINS

TECHNICAL FIELD

This invention relates to methods of and apparatus for straightening pins supported in a backplane. This invention particularly relates to methods of and apparatus for straightening groups of pins in a first plane and thereafter straightening the groups of pins in a plane perpendicular to the first plane.

BACKGROUND OF THE INVENTION

In the manufacture of some types of rigid pin-populated printed wiring boards, as many as 10,000 terminal pins are inserted into apertures of each of the boards. The boards are referred to as backplanes and typically measure eight inches by twenty-two inches on their sides. The pins electrically engage portions of printed wiring on the backplanes to provide for connections to external circuits. Typically, the spacing between adjacent apertures on each backplane is extremely small. For example, the spacing between apertures on one backplane is 0.125 inch. Further, each terminal pin typically has a square cross section of, for example, 0.025 inch except in those areas where the pin is formed with (1) lateral ears having a push shoulder and (2) an aperture-engaging portion intermediate the ends thereof. The pin is relatively slender and typically measures one and one-half inches in length.

Each of the pins have slender shank portions which extend from opposite sides of the backplane. After the pins have been assembled with the backplane, the backplane is mounted in a frame where external wiring is wire wrapped to the pins on one side of the backplane commonly referred to as the wiring side. Other printed wiring boards, referred to as circuit packs, have electronic components electrically and mechanically secured thereto and have connectors secured to one end thereof. The connectors of these boards ultimately are inserted over selected ones of the pins extending from the other side of the backplane commonly referred to as the component side.

During the insertion of the pins into the apertures of the backplane and during subsequent handling of the pin-populated backplane, some of the pins may be bent undesirably. For example, the most severely bent pins may deviate from an axial centerline by 0.050 inch in any direction. Consequently, adjacent pins which are bent in opposite directions could have a deviation swing of 0.100 inch.

Since the component side of the pins are destined for insertion into a connector, and the pins on the wiring side may be wired by an automatic wiring facility, it is important that the pins be axially straight and perpendicular to the plane of the backplane within an acceptable tolerance. Otherwise, a slightly bent pin on the component side, for example, could be misaligned with its mating aperture in the connector. As the connector is moved into place, the bent pin would engage the face of the connector and would be bent further towards the surface of the backplane thereby failing to provide the required electrical connection.

Since the pins are located on a grid spacing of 0.125 inch, and since the pins have a square cross section of 0.025 inch, the facing portions of adjacent pins are 0.100 inch apart. Consequently, it is most difficult to provide a facility for straightening pins which are so closely arranged. For example, a straightening facility typically is positioned over the tip of the pin to be straightened and is then moved in a selected motion whereby the walls of the opening engage and move the pin close to the centerline of the opening. To accomplish this straightening operation, a pin-receiving opening of the facility must be slightly larger in cross section than the cross section of the pin. Further, to insure that a bent pin will enter the pin-receiving opening, the mouth of the opening should be formed with a tapered or conical lead-in portion of sufficient dimension to receive any pin having a deviation as severe as 0.050 inch. Thus, the conical lead-in portion of the opening would require additional space in the cross sectional direction. In addition, the facility must have some bulk around the pin-receiving opening to provide for the opening and the conical lead-in portion. Thus, it is apparent that, with the close spacing between adjacent pins, it is most difficult to provide a sturdy facility which can accomplish the straightening of the pin.

Still another problem encountered in straightening the pins is due to warpage of the backplane after the pins have been inserted into the backplane. Such warpage is due to the pin density and the interfacial relationship between the apertures and the pins. Consequently, while any pin may be perpendicular with the backplane, if the backplane is warped, the tip of the pin would appear to be bent. This would provide indication that the pin requires straightening even though the pin is perpendicular with the portion of the backplane surrounding the aperture into which the pin is mounted.

As noted above, as many as 10,000 pins are typically inserted into apertures of a single backplane. In a typical manufacturing operation, many pin-populated backplanes are assembled within relatively short periods of time. For example, in one manufacturing operation, 160 pin-populated backplanes can be assembled within a single day. Since each pin on the component side of each backplane must be straightened, and since there is such a large number of pins to be straightened, efficiency dictates that pluralities of pins be straightened simultaneously. However, when such mass pin straightening is considered, the above-mentioned problems resulting from the closeness of adjacent pins and warpage of the backplane pose serious difficulties.

Since the shanks of the pins are slender, it is important that the straightening forces not be excessive to the extent that the pins are damaged. Additionally, during the pin straightening operation, the portions of the pins which are mounted within apertures of the backplane must not move laterally. Otherwise, lateral movement of the pins within the apertures could result in damage to the backplane. Lateral pin movement within the apertures can occur when the backplane is permitted to move during the pin straightening operation. Thus, it is important that the backplane be rigidly secured to prevent any of the straightening motion from being transmitted to the backplane. Further, it is important that the pins to be straightened be visible immediately before the assembly of the straightening facilities with the pins. If the pins are inserted into an enclosure, wherein the pins are not visible, and are then inserted into a straightening facility, there is no way to determine whether any of the pins were bent considerably beyond a position of assembly with the facility. In this instance, the bent pins could be deformed against the backplane by the straightening facility. If a straightening operation is then conducted, the backplane and other pins could be damaged.

In one prior system which provides facility for limited mass straightening of pins, a single bar has two rows of pin-receiving apertures formed in one surface thereof and is referred to hereinafter as the double-row bar. The pin-populated backplane is mounted on a table below the double-row bar. The double-row bar is lowered to position the tip ends of two adjacent rows of a plurality of rows of the pins into the pin-receiving apertures of the bar. Thereafter, the double-row bar is reciprocated, or wiggled, in the plane of the rows of pins which is referred to as the "X" direction. As the double-row bar is wiggled, the pins engage laterally spaced walls of the apertures whereby each of the pins is generally aligned in the "X" direction. The table is then reciprocated, or wiggled, in a plane referred to as the "Y" direction which is perpendicular to the plane of the "X" direction movement whereby the same pins are generally aligned in the "Y" direction. Thus, by this action, each of the pins in the two rows could be generally aligned with the centerline of the respective pin-receiving aperture. The double-row bar is then retracted and the table is indexed to locate the next two rows of pins directly beneath the two rows of apertures of the double-row bar. The double-row bar is then lowered and a straightening operation conducted a described above. This process continues until all pins are straightened. A prior system of this type, performs the straightening operation as described providing the grid spacing of the pins in the backplane is sufficiently spaced to avoid engagement by the double-row bar with previously straightened pins during the wiggle motion in the "Y" direction.

A prior system of this type is commercially available from Ambrit, Inc. of Wilmington, Massachusetts, as their Model No. 218.

In order to provide for the straightening of pins located on a grid spacing of 0.125 inch, a single bar having one row of apertures which is referred to hereinafter as the single-row bar, was utilized as described hereinabove. The width of the single-row bar measures about 0.145 inch. Thus, when the single-row bar is positioned over a single row of pins, the sides of the bar are located 0.040 inch from the pins of the immediately adjacent rows. A conical lead-inportion for each aperture of the single-row bar has a mouth diameter of 0.100 inch to insure that drastically bent pins are inserted into the pin-receiving aperture. The "X" and "Y" wiggle motion is the same as described above with respect to the double-row bar. In order to provide sufficient straightening effect in the "Y" direction, the table is wiggled to provide a 0.100 inch movement on each side of the centerline of the row of pins within the apertures of the single-row bar. Since the pins of the adjacent rows are only 0.040 inch from the side of the single-row bar, the adjacent pins are bent away from the pins located within the bar.

In order to compensate for this effect, a first row of pins located within the single-row bar are initially and properly straightened in the "X" direction. Thereafter, the table is wiggled, as noted above, in the "Y" direction. However, the pins of the first row are purposely not fully straightened in the "Y" direction but are leaning slightly in the "Y" direction toward the adjacent or second row of pins which is the next row to be straightened. The single-row bar is then retracted and positioned over the second row of pins which are then straightened properly in the "X" direction. Thereafter, the bar is wiggled in the "Y" direction between the first and a third row of pins.

As noted above, the pins of the first row have been straightened in the "X" direction but are leaning slightly in the "Y" direction toward the second row of pins, the tip ends of which are now located within the apertures of the single-row bar. As the single-row bar is wiggled in the "Y" direction, one side of the bar engages the slightly bent pins of the first row and bends the pins in the "Y" direction so that the pins are now leaning away from the second row of pins. As the single-row bar moves in the wiggle motion toward the third row of pins and away from the first row of pins, the pins of the first row now tend to return to the initial position of leaning toward the second row of pins but only spring to a generally straightened position. After the bar has completed its wiggle in the "Y" direction, the pins of the second row are leaning slightly in the "Y" direction toward the third row of pins. In this way, the pins of the first row are now generally straight but the pins of the second row are leaning in the "Y" direction toward the pins of the third row.

The single-row bar is then retracted and positioned over the tip ends of the pins of the third row and the pins are straightened in the "X" direction. The bar is then wiggled in the "Y" direction whereby the pins of the second row are straightened in the "Y" direction in the same manner previously described with respect to the pins of the first row.

This pattern of operation is continued whereby the table is indexed in the "Y" direction to position successive rows of pins beneath the single-row bar. The single-row bar is then lowered over the tips of the pins and wiggled to straighten the pins in the "X" direction. The bar is then wiggled in the "Y" direction to effectively straighten the pins of the immediately trailing row in the "Y" direction while leaning the row of pins positioned within the bar toward the immediately forward row of pins. Ultimately, all pins of the backplane are thereby straightened in the "X" and "Y" directions.

The above-described single-row bar straightens one row of pins at a time. In addition, due to the closeness of the adjacent rows of pins, the single-row bar system must depend on the side of the bar for straightening the pins in the "Y" direction. Further a limited number of pins is straightened using the single-row bar.

U.S. Pat. No. 3,779,291, which issued to Herbert G. Yeo on Dec. 18, 1973, discloses a machine for straightening simultaneously all of the pins secured to a multiple pin board. The board-secured pins are simultaneously located in holes of a plate whereafter relative motion is provided between the plate and the board. The motion is time and controlled as to the amount, direction and sequence of relative motion imparted. Ultimately, axial deformity of any of the pins is corrected.

The machine disclosed in U.S. Pat. No. 3,779,291, initially requires that the board be positioned so that the pins can be inserted face down through apertures of a fixed plate. Since the pins are positioned face fown, it is difficult for any operator to visually insure that all of the pins are guided through the apertures of the fixed plate. Once the pins have been inserted through the apertures of the fixed plate, the tips of the pins must be blindly located within apertures of a movable grid plate concealed within an enclosure of an operating table. If any of the pins had been bent during insertion through the fixed plate, and would therefore not be inserted into the movable grid plate, the operator could not determine this due to the concealment of the grid plate.

After the tips of the pins have been inserted into the apertures of the grid plate, a cover is lowered over the upwardly facing side of the board and clamped in the closed position by latches. A resilient facing pad, located on the inner surface of the cover, is positioned in engagement with the upwardly facing side of the board and thereby does not provide rigid clamping of the board.

Since all pins are to be straightened by the motion of the grid plate, apparently considerable forces are required through the mechanisms of the plate-moving system. The forces are transmittable through the pins and could cause movement of the board which is not rigidly clamped but is pressing against the resilient facing pad. Such motion could cause movement of the pins laterally within the apertures of the board resulting in damage to the pins and the board.

SUMMARY OF THE INVENTION

In a method of straightening pin supported in a backplane, in accordance with certain principles of the invention, tips of the pins are captured only within a first planar surface of a pin straightening assembly. The assembly is reciprocated in a first plane to straighten the pins in the direction of the first plane. The pin tips are captured only within a second planar surface of the assembly which is recessed from the first plane in a direction away from the pins to be straightened. The backplane is reciprocated in the second plane to strighten the pins in the direction of the second plane.

An apparatus for straightening pins supported in a backplane, in accordance with certain principles of the invention, includes means having a pin-capturing surface located in a first plane for straightening the pins in a first direction. Means are also provided for straightening the pins in a second direction and includes a pin-capturing surface located in a second plane recessed from the first plane in a direction away from the pins to be straightened. The first-direction and second-direction straightening means are supported for common movement. The backplane is supported with the pins extending toward the commonly supported first-direction and second-direction straightening means.

Means are provided for selectively moving the commonly supported first-direction and second-direction straightening means to (1) capture pin tips only within the first direction straightening means, (2) reciprocate the common supporting means in the plane of the first-direction straightening means and (3) capture pin tips only within the second-direction straightening means. Means are also provided for selectively moving the backplane supporting means in the plane of the second-direction straightening means.

BRIEF DESCRIPTION OF THE DRAWINGS

FIG. 1 is a partial perspective view showing a backplane having a plurality of pins mounted therein;

FIG. 2 is a perspective view showing one of the pins of FIG. 1;

FIG. 3 is a front view of an apparatus for providing motion to straighten the pins of FIG. 1;

FIG. 4 is a side view of the apparatus of FIG. 3;

FIG. 5 is an exploded perspective view of a fixture and clamping cover for supporting the backplane within the apparatus of FIGS. 3 and 4 in accordance with certain principles of the invention;

FIGS. 6 and 7 are partial cross-sectional views showing details of the fixture of FIG. 5;

FIG. 8 is an end view showing portions of the clamping cover of FIG. 5;

FIG. 9 is a cross-sectional view showing details of a portion of the clamping cover of FIG. 5;

FIG. 10 is a partial cross-sectional end view of the assembled fixture and clamping cover of FIG. 5;

FIG. 11 is a perspective view of a straightening assembly in accordance with certain principles of the invention;

FIG. 12 is a bottom view showing the undersurfaces of the straightening assembly of FIG. 11;

FIG. 13 is a cross-sectional view taken along lines 13—13 in FIG. 12 showing the location of apertures in the straightening assembly of FIG. 12;

FIG. 14 is a side view of the straightening assembly of FIGS. 11, 12 and 13 showing the securing position of the assembly with a portion of the apparatus of FIGS. 3 and 4;

FIGS. 15 through 23 are schematical views showing the steps of processing through a pin straightening operation; and FIG. 24 is a side view showing the straightening assembly of FIGS. 11 through 14 in a pin straightening mode.

DETAILED DESCRIPTION

As illustrated in FIG. 1, a plurality of pins, designated generally by the numeral 31, are inserted into a printed wiring board or backplane 32 to form a pin-populated backplane assembly, designated generally by the numeral 33. Referring to FIG. 2, each pin 31 is formed with an upper shank 34, a shoulder section 36, an aperture-engaging section 37 and a lower shank 38. The shanks 34 and 38 typically have a square cross section measuring 0.025 inch on each side while the pin 31 measures one and one-half inches in length.

The backplane 32 (FIG. 1) typically has side dimensions of eight inches by twenty-two inches and may be formed with as many as 10,000 apertures 39 arranged in a grid of 0.125 inch spacing between centers of adjacent apertures. Thus, the facing sides of the shanks 34 and 38 of adjacent pins 31 in the back plane assembly 33 are spaced 0.100 inch apart.

The aperture-engaging sections 37 of the pins 31 are inserted into corresponding apertures 39 of the backplane 32 whereby the pins are supported with the backplane to form the assembly 33. The upper shanks 34 of the pins 31 are ultimately assembled at a high level of assembly with connectors of component-containing printed wiring boards (not shown). Therefore, the side of the backplane 32 adjacent to the upper shanks 34 is referred to as the component side 41. The lower shanks 38 are ultimately connected to wiring of external circuits. Therefore, the side of the backplane 32 adjacent the lower shanks 38 is referred to as the wiring side 42. The backplane 32 is formed with three alignment apertures 43 (one shown) located at three corners of the backplane.

As noted, the upper shanks 34 ultimately mate in a high level assembly operation with connectors of printed wiring boards. Therefore, it is important that the upper shanks 34 be axially straight and perpendicular to the component side 41 of the backplane 32 to facilitate the high level of assembly. In addition, the lower shanks 38 are frequently wired by the use of automatic wiring facilities (not shown). Therefore, it is important that the lower shanks 38 be axially straight and perpendicular to the wiring side of the backplane 32.

After the pins 31 have been assembled with the backplane 32, the backplane has a tendency to warp or bow due to pin density and the interfacial relationship between the apertures 39 and the pins. If the backplane 32 is warped in the vicinity of assembly with a given pin 31, the pin may be perpendicular with the backplane but still appear to be bent at the tip end thereof. The backplane 32 will be mounted in a flat condition in its ultimate environment. Therefore, it is important that the backplane be flat during any pin straightening operation so that the reference basis for pin straightening is compatible with the environmental backplane mounting.

Referring to FIGS. 3 and 4, there is illustrated an apparatus, designated generally by the numeral 44, for facilitating the straightening of the backplane-supported pins 31. The apparatus 44 includes a horizontal table 46 supported by four vertical legs 47 which extend to a floor (not shown). The table 46 is composed of granite which was selected because of its superior dimensional stability and vibration damping characteristics.

A platform 48 is mounted for movement on a pair of spaced parallel dove-tail rails 49 which are mounted to the top of the table 46. As illustrated in FIG. 4, a lead screw 51 is supported at opposite ends by bearings 52 which are mounted to the top of the table 46. A motor 53 is coupled to one end of the lead screw 51 and provides the drive to rotate the lead screw. A ball nut 54 is secured to the underside of the platform 48 and is threadedly positioned about the lead screw 51 for axial movement along the lead screw when the lead screw is rotated. Thus, rotation of the lead screw 51 provides motion for the platform 48 over the rails 49 in the plane of the platform.

A pair of rubber shades 56 and 57 are each connected at a free end thereof to opposite ends of the platform 48. The other ends of the shades 56 and 57 are attached to spring-loaded reels 58 and 59, respectively, which are mounted to the top of the table 46. As the platform 49 is moved to the left or to the right, as viewed in FIG. 4, the shades 56 and 57 are maintained continuously and protectively over facilities located on the top of the table 46.

Referring to FIG. 3, a pair of spaced vertical stands 61 are mounted on and extend upwardly from the top of the table 46. A horizontal support 62 extends between and is supported on the top of the vertical stands 61. A pair of lead screws 63 and 64 are mounted vertically near lower ends thereof in a bearing plate 65. The upper ends of the lead screws 63 and 64 are mounted within a housing 66 which supports a motor 67 on the top thereof. A timing belt (not shown) and pulleys (not shown) are contained within the housing 66 and facilitate the application of driving power from the motor 67 to the lead screws 63 and 64 when the motor is operated. Ball screws (not shown), also contained within the housing, are threadedly positioned about the lead screws 63 and 64 and move axially along the lead screws when the lead screws are rotated.

The ball screws are coupled to a pair of shafts 68 and 69 and provide for the vertical movement of the shafts when the lead screws 63 and 64 are rotated. The shafts 68 and 69 pass through bearing housings 71 and 72, respectively, and support a holding bar 73 at the lower ends of the shafts. Thus, as the motor 67 rotates the lead screws 63 and 64, the shafts 68 and 69 are moved vertically to selectively move and position the holding bar 73 in the plane thereof. A pair of stops 74 and 76 extend downwardly from the bearing housings 71 and 72, respectively, to limit the upward travel of the holding bar 73.

The bearing plate 65 and a bottom plate 75 extend between and are secured to the bearing housings 71 and 72. The lead screws 63 and 64, the plates 65 and 75, the housing 66, the motor 67, the shafts 68 and 69, the holding bar 73 and the stops 74 and 76 form a slide assembly designated generally by the numeral 77. The slide assembly 77 is mounted on a pair of spaced dove-tail rails 78 on the upper and undersurfaces of the support 62. A lead screw 79 is mounted at opposite ends thereof in bearing supports 81 and 82 and is coupled at one end to a motor 83. A ball nut 84 is threadedly positioned about the lead screw 79 and is secured to the bearing plate 65 of the slide assembly 77. When the motor 83 is operated, the lead screw 79 is rotated and the ball screw 84 moves axially along the lead screw. As the ball screw 84 moves, the slide assembly 77 is moved horizontally over the rails 78 whereby the holding bar 73 is moved horizontally between the vertical stands 61 and in the plane of the holding bar.

Vertical movement of the slide assembly 77, wherein the holding bar 73 moves vertically in the plane thereof, is referred to hereinafter as movement in the "Z" direction. Horizontal movement of the slide assembly 77, wherein the holding bar 73 moves horizontally in the plane thereof, is referred to hereinafter as movement in the "X" direction. Referring to FIG. 4, movement of the platform 48, wherein the platform moves horizontally in the plane thereof, is referred to hereinafter as movement in the "Y" direction.

The portion of the apparatus 44, as illustrated in FIGS. 3 and 4 and which has been described hereinabove, and a system for controlling that portion of the apparatus, is a commercially available facility from Ambrit, Inc. of Wilmington, Massachusetts, as their Model No. 218.

Referring to FIGS. 11 through 14, the apparatus 44 also includes a pin-straightening bar assembly, designated generally by the numeral 85, which is also illustrated in phantom in FIGS. 3 and 4. Referring to FIGS. 5 and 10, the apparatus 44 further includes a backplane support fixture, designated generally by the numeral 86, which is also illustrated in phantom in FIGS. 3 and 4.

The fixture 86 is rigidly mounted to the platform 48 (FIGS. 3 and 4) for movement therewith and in precise alignment with the pin-straightening bar assembly 85. As illustrated in FIGS. 5 and 10, the fixture 86 includes a horizontal backplane support 87 and two vertical support plates 88 and 89. A pair of alignment apertures 90 are formed through diagonally opposite corners of the support 87. The support 87 is also formed with a central opening 91 (FIG. 5) in the upper surface 92 thereof. A pair of slide rails 93 and 94 are mounted to the fixture 86 along and within opposite longitudinal sides of the opening 91 slightly below the plane of the upper surface 92. A support slide 96 extends between, and is formed with notches which fit over, the rails 93 and 94 and facilitate sliding movement of the slide over the rails. The upper surface of the slide 96 is flush with the upper surface 92 of the support 87. Each of a pair of spacer inserts 97 (one shown) is formed with a longitudinal notch 98 formed in an undersurface to facilitate positioning of the inserts onto the rails 93 and 94. The upper surface of each of the positioned inserts is flush with the upper surface 92 of the support 87. In some codes of backplanes 32, there is an absence of pins 31 in areas of the backplane between the sides thereof. In this instance, as illustrated in phantom in FIG. 5, cross supports 120 having notches formed therein can be placed in a spanning position between the rails 93 and 94 to provide central support for the backplane 32. When the cross supports 100 are used, spacer inserts 97 of shorter lengths are positioned on the rails 93 and 94 between adjacent, spaced cross supports. When used, the upper surfaces of the cross supports 100 are flush with the upper surfaces of the inserts 97 and the support 87.

Referring to FIGS. 5, 6 and 10, two inverted T-shaped slots 99 are formed in the upper surface 92 of the support 87. Each of the slots 99 contain a plurality of T-shaped nuts 101 (one shown in FIGS. 6 and 10). Each of the T-shaped nuts 101 is threadedly attached to a screw 102 having an enlarged head 103.

Referring to FIGS. 5 and 7, the support 87 is formed with a shelf 104 which extends from one corner of the opening 91 with an upper surface which is flush with the upper surface 92 of the support 87. As illustrated in FIG. 7, an aperture 106 is formed in the upper surface of the shelf 104 with an alignment pin 107 extending outwardly therefrom. A bushing 108 is located within an upper portion of the aperture 106 to contain the pin 107. The pin 107 is formed with a head 109 which prevents the pin from moving upwardly through the bushing 108 any further than illustrated. A compression spring 111 is captured within the lower portion of the aperture 106 between the lower end of the pin 107 and a cap 112 which is fastened to the shelf 104. The spring 111 normally biases the pin 31 upwardly to the position illustrated in FIG. 7. When the fixture 86 is mounted on the platform 48 (FIGS. 3 and 4), the pin 107 is precisely located with respect to the pin-straightening bar assembly 85. The pin 107 serves as a datum reference point for locating the backplane 32 on the fixture 86 and for the eventual locating of the bar assembly 85 with respect to the location of each pin 31 to be straightened. A pair of pins 113 and 114 extend upwardly from the upper surface of the slide 96. The pins 113 and 114 are identical to pin 107 and are biased upwardly in the same manner as pin 107.

In use, a pin-populated backplane 32 is selected for positioning on the fixture 86 in preparation for a pin straightening operation. The length of the backplane 32 is different for different codes. Two spacer inserts 97, the length of which depends upon the length of the backplane, are positioned onto the rails 93 and 94. As an alternative, the cross supports 100 can be used where the code of the backplane 32 permits such use. The slide 96 is then moved over the rails 93 and 94 toward the positioned inserts 97. The backplane 32 is manipulated to position one of the alignment apertures 43 (FIG. 1) over the alignment pin 107. The backplane 32 is then lowered over the opening 91 so that the lower shanks 38 (FIGS. 1 and 2) of the pins 31 are located within the opening. As the lower shanks 38 are lowered into the opening 91, another alignment aperture 43 of the backplane 32 is located generally in the vicinity of the alignment pin 114. If the aperture 43 is not precisely aligned with the pin 114, the slide 96 can be manipulated on the rails 93 and 94 to bring the pin 114 into alignment with the aperture 43. Since there is no alignment aperture 43 in the corner of the backplane 32 adjacent to the pin 113, the pin is depressed by the weight of the backplane. When the backplane 32 is inverted to straighten the portions of the pins 31 extending from the wiring side, one of the alignment apertures 43 is positioned over pin 113 during the alignment of the backplane on the fixture 86. As the backplane 32 seats on the fixture 86, the peripheral edges of the backplane rest on the adjacent supporting structure of the fixture formed by upper surfaces of the support 87, the slide 96 and the inserts 97 all of which are in the same plane. In this position, the pins 31 to be straightened are in full view for inspection. If cross supports 100 are used, adjacent portions of the backplane 32 will eventually rest on the upper surfaces of the cross supports.

As noted hereinabove, it is critical that the backplane 32 be essentially flat when the pins 31 are being straightened. Thus, the flatness of the backplane-supporting surface during the pin straightening operation is highly critical. To accommodate this requirement, the fixture 86 is a highly machined facility which provides the necessary flat surface for supporting the backplane 32 during a pin straightening operation.

As noted hereinabove, the pin-populated backplane 32 may be warped which could present an erroneous condition regarding the straightness of the pins 31. Consequently, it is most important that the backplane 32 be flat against the flat surface of the fixture 86 during the pin straightening operation.

Referring to FIG. 5, there is illustrated a flat clamping cover, designated generally by the numeral 116. The cover 116 is formed with a plurality of apertures 117 corresponding in number to, and arranged in the same grid pattern as, the apertures 39 (FIG. 1) of the backplane 32. Each of the apertures 117 (FIGS. 9 and 24) is of sufficient diameter, for example, 0.093 inch, to receive the shoulder section 36 of the pin 31. The cover 116 is formed with two through slots 118 having enlarged portions 119. A pair of handles 121 are attached to opposite ends of the cover 116. A pair of handles 121 are attached to opposite ends of the cover 116. A pair of dowel pins 122 are mounted in diagonally opposite corners of the cover 116 and extend downwardly therefrom.

As illustrated in FIGS. 5, 8 and 10, the underside of the cover 116 is cut away from one end to the other and is slightly wider than the width of the backplane 32 to form a backplane nest 123. As illustrated in FIGS. 9 and 24, the mouth of each aperture 117 is formed with a conical entry surface 124.

Referring to FIGS. 5 and 10, after the pin-populated backplane 32 has been seated on the fixture 86, the nuts 101 and screws 102 are precisely located and the cover 116 is located to position the pins 122 in alignment with the alignment apertures 90 of the support 87. As the cover 116 is then lowered, the dowel pins 122 move into the aligning apertures 90 and the heads 103 of the screws 102 move through the enlarged portions 119 of the slots 118 and project beyond the upper surface of the cover. The heads 103 of the screws 102 are then gripped and moved along the slots 118 and away from the enlarged portions 119. Also, as the cover 116 is lowered onto the fixture 86, the shanks 34 of the pins 31 supported in backplane 32 are moved through the apertures 117 and project from the upper surface of the cover. Typically, the most drastic pin deviation is 0.050 inch from center. The conical surface 124 (FIGS. 9 and 24) is sufficiently wide, for example 0.125 inch in diameter, to capture the most drastically bent pins 31. Further, as the cover 116 is lowered onto the fixture 86 the nest 123 is firmly positioned in engagement with the adjacent portions of the upper surface of the backplane 32. Thereafter, the screws 102 are tightened to draw the nuts 101 upwardly within the slots 99 to clamp the cover 116 with the fixture 86. In this manner, the backplane 32 is clamped firmly between the cover 116 and the underlying structure of the fixture 86 which supports the backplane as illustrated in FIG. 10. The clamping of the backplane 32 serves to flatten the backplane between the fixture 86 and the cover 116 and to rigidly secure the backplane in preparation for a pin-straightening operation. It is noted that the pins 31 to be straightened remain in full view for inspection.

Referring to FIGS. 11 and 12, the bar assembly 85 includes cross bar 126 and five parallel spaced bars 127, 128, 129, 130 and 131. The spaced bars 127 through 131 are attached perpendicularly at one end thereof to the cross bar 126. A cross support 132 is attached to and spans perpendicularly the spaced bars 127 through 131 near the free ends thereof to provide stability for the extended spaced bars. As illustrated in FIG. 12, pin-capturing undersurfaces of the bars 126 through 131 are each formed with five rows of apertures 133 where the rows extend generally from end to end of the bars. In the preferred embodiment, the cross bar 126 is twenty-four inches in length and is formed with one-hundred and ninety-two apertures 133 in each row for a total of nine-hundred and sixty apertures. Each of the spaced bars 127 through 131 is twelve inches in length and is formed with ninety-six apertures 133 in each row for a total of four-hundred and eighty apertures in each spaced bar. Thus, the cross bar 126 is of sufficient length to span the length of the backplane 32 and each of the spaced bars 127 through 131 is of sufficient dimension to span the width of the backplane.

Referring to FIG. 13, one of the apertures 133 of each of the five rows in the bar 126 is illustrated. The arrangement of the apertures 133 in the five rows of each of the bars 127 through 131 (FIG. 12) is identical to that illustrated in FIG. 13. Each of the apertures 133 is formed with a conically shaped mouth 134. Referring to FIG. 14, the pin-capturing undersurfaces of the spaced bars 127 through 131 are planar and are recessed by 0.3125 inch from the pin-capturing undersurface of the cross bar 126. The bar assembly 85 is attached to the holding bar 73 (FIGS. 3 and 4) for movement therewith and is positionable over the tips of the shanks 34 of the pins 31 extending upwardly from the fixture 86. The bar assembly 85 is attached to the holding bar 73 in precise relation to the datum reference point represented by the alignment pin 107 (FIG. 5) of the fixture 86 to provide for precise alignment between the bar assembly and the pins 31 to be straightened.

In use, the bar assembly 85 is indexed through successive steps to capture the tips of successive groups of the fixture-supported pins 31 within the apertures 133 of the cross bar 126 to facilitate straightening of the pins in the "X" direction. Ultimately, the bar assembly 85 is indexed through successive steps to capture the tips of the fixture-supported pins 31 within apertures 133 of spaced bars 127 through 131 to facilitate straightening of the pins in the "Y" direction. The conically shaped mouth 134 of each aperture 133 is sufficiently wide, for example 0.125 inch in diameter, to capture bent pins 31 which deviate from a fixed datum by as much as 0.050 inch. In addition, the diameter of each aperture 133 is 0.043 inch which is sufficiently large enough to capture the 0.025 square cross section tip of the pin 31.

For the purpose of describing and illustrating the pin straightening operation, reference will be made to FIGS. 15 through 23. In order to simplify the description and illustration, the backplane 32 will contain two rows of four pins 31 each in the "X" direction and which form four columns of two pins each in the "Y" direction. The cross bar 126 will be formed with one row of four apertures 133. Only two spaced bars 127 and 128 will be illustrated with each spaced bar being formed with one row of two apertures 133. However, it is to be understood that, in the preferred embodiment, each of the bars 126 through 131 are formed with five rows of apertures and are assembled as illustrated in FIGS. 11 and 12 and as described hereinabove.

Referring to FIG. 20, the platform 48 (FIGS. 3 and 4) is indexed by motor 53 (FIG. 4) to move the fixture 86 (FIG. 5) and the backplane 32 supported thereon to position the first row of four pins 31 directly beneath the cross bar 126. The motor 67 (FIGS. 3 and 4) is then operated to lower the holding bar 73 and the bar assembly 85 in the "Z" direction. As the bar assembly 85 is lowered the tips of all of the pins 31 of the first row are guided into and captured within the apertures 133 of the cross bar 126 as illustrated in FIG. 15.

Thereafter, motor 83 (FIG. 3) is operated to rotate lead screw 79 (FIG. 3) in a first direction and then reverse the direction of rotation. Reversing the rotational motion which is applied to lead screw 79 results in the reciprocation of the holding bar 73 whereby cross bar 126 wiggles in a left-right pattern in the plane of the "X" direction as viewed in FIG. 20. During the wiggle movement of the cross bar 126, the captured tips of the pins 31 of the first row engage and are moved by the walls of the cross bar apertures 133 to effect the straightening of the pins in the "X" direction. In the preferred embodiment, the cross bar 126 is reciprocated several times in a wiggle pattern to move each cross bar aperture 133 in the "X" direction by a distance of 0.100 inch on each side of the centerline of the aperture 133 which represents the centerline of an ideally straight pin 31. Motor 67 is then operated to raise the bar assembly 85 so that the undersurface of the cross bar 126 is above the tips of the pins 31.

Motor 53 is operated to index the platform 48 to locate the second row of pins 31 beneath the cross bar 126 as illustrated in FIG. 21. Thereafter, motor 67 is operated to lower the bar assembly 86 to position the cross bar apertures 133 to capture the tips of the second-row pins 31 as illustrated in FIG. 16. Motor 83 is again operated to wiggle the cross bar 126 as previously described to straighten the pins 31 of the second row in the "X" direction. As illustrated in FIG. 16, the pin-capturing undersurfaces of bars 127 and 128 are recessed from the pin-capturing undersurface of cross bar 126. Therefore, when the cross bar 126 is lowered to effect the straightening of the second row of pins 31, the undersurfaces of spaced bars 127 and 128 are not lowered sufficiently for the apertures 133 thereof to be positioned about or engage any of the pins. Thus, the feature of recessing the spaced bars 127 and 128 permits freedom of straightening the pins in the "X" direction by the cross bar 126 without interference from or concern for the spaced bars which later effect straightening in the "Y" direction.

Thereafter, motor 67 is operated to raise bar assembly 85 so that the undersurface of the cross bar 126 is above the tips of the pins 31. Motor 53 is then operated to index the platform 48 to position apertures 133 of spaced bar 128 above an adjacent first pair of pins 31 in a first column of the pins as illustrated to the left in FIG. 22. At the same time, apertures 133 of spaced bar 127 are positioned above an adjacent second pair of pins 31 in a third column of the pins which is alternately spaced from the first column of pins beneath spaced bar 128. Motor 67 is then operated to lower the bar assembly 85 a sufficient distance to capture the tips of the first and second pair of pins 31 within the aligned apertures 133 of the spaced bars 127 and 128 as illustrated in FIGS. 17 and 18. Motor 53 is then operated to reciprocate or wiggle platform 48 in the plane of the "Y" direction. The pins 31 having tips captured within the apertures 133 of spaced bars 127 and 128 are thereby straightened in the "Y" direction.

Referring to FIG. 17, cross bar 126 has been lowered a distance greater than the cross bar was lowered in the straightening of the pins 31 in the "X" direction in order to lower sufficiently the spaced bars 127 and 128. However, the cross bar 126 has now been moved to a position beyond the area above the pins 31. Therefore, the cross bar 126 is not in a position to interfere with the straightening of the pins 31 in the "Y" direction.

Motor 67 is operated to raise the bar assembly 85 so the undersurfaces of the spaced bars 127 and 128 are spaced above the tips of the pins 31. Motor 83 is then operated to move the bar assembly 85 from the position illustrated in FIG. 22 to the right to the position illustrated in FIG. 23. As illustrated in FIG. 23, the apertures 133 of the spaced bar 128 are now located above a third pair of pins 31 in a second column of the pins which are to the right of the first pair of pins as viewed in FIG. 23. The apertures 133 of the spaced bar 127 are located above a fourth pair of pins 31 in a fourth column of the pins which are to the right of the second pair of pins as viewed in FIG. 23. Motor 67 is then operated to lower the bar assembly 85 a sufficient distance to capture the tips of the third and fourth pair of pins 31 within the aligned apertures 133 of the spaced bars 127 and 128 as illustrated in FIG. 19. Thereafter, motor 53 is operated to reciprocate platform 48 to wiggle the backplane 32. In this manner, the pins 31, whose tips are located in the apertures 133 of the spaced bars 127 and 128, are straightened in the "Y" direction.

Motor 67 is then operated to move the bar assembly 85 upwardly until the undersurface of the cross bar 126 is located above the plane of the tips of the pins 31. Motor 83 is operated to move the bar assembly 85 to its original start position and motor 53 is operated to move the platform 48 to its original start position to complete the straightening of the pins 31.

Thus, during the pin-straightening operation, the backplane 32 is assured of being held flat so that the pins 31 are straightened generally perpendicularly to a reference base which supports the pins. In addition, the backplane 32 is rigidly secured during the pin-straightening operation which prevents any lateral motion of the backplane when straightening forces are being applied to the pins 31. Further, the design of the bar assembly 85 permits the straightening of the pins 31 in the "X" direction and then in the "Y" direction without interfering with the straightened condition of the pins 31 in the "X" direction. Still further, the design of the bar assembly 85 permits the simultaneous straightening in the "X" direction of a plurality of pins 31 and then the simultaneous straightening in the "Y" direction of the same plurality of pins.

It is also noted that, while the foregoing description relating to FIGS. 15 through 23 refers to cross bar 126 and only two spaced bars 127 and 128, the preferred embodiment utilizes the bar assembly 85 illustrated in FIGS. 11 through 14. Further, while the cross bar 126 and the spaced bars 127 and 128 (FIGS. 15 through 23) each contain only one row of apertures 133, the bars 126 through 131 of the preferred embodiment, as illustrated in FIGS. 11 through 14, each contain five rows of apertures 133. Each row of apertures 133 of the cross bar 126 contains, for example, one-hundred and ninety-two apertures while each row of apertures of the spaced bars 127 through 131 contain, for example, ninety-six apertures. Therefore, as many as nine-hundred and sixty pins 31 can be straightened simultaneously in the "X" direction by the cross bar 126 and as many as twenty-four hundred pins can be straightened simultaneously in the "Y" direction by the five spaced bars 127 through 131.

As an example, if the backplane 32 supports nine thousand pins 31 arranged in sixty rows of one-hundred and fifty pins each in the "X" direction, the cross bar 126 will span the entire length of five rows of pins during each "X" direction straightening operation. Therefore, the cross bar 126 will make twelve straightening passes across the backplane 32 to straighten the nine thousand pins 31. The nine thousand pins 31 supported by the backplane 32 are arranged in one-hundred and fifty columns of sixty pins each in the "Y" direction. Thus, the spaced bars 127 through 131 will each span in the "Y" direction all of the pins in the below-positioned five columns of pins 31 for a total of one-thousand, five hundred pins which are straightened during each "Y" direction straightening operation. Therefore, the spaced bars 127 through 131 will have to make six straightening passes along the length of the backplane 32 to straighten the nine thousand pins 31.

While the above-described bar assembly 85 is illustrative of the preferred embodiment, other combinations of the number of spaced bars, and the numbers of apertures in each row of all of the bars can be selected without departing from the spirit and scope of the invention. In addition, while the above-described fixture 86 and clamping cover 116 are illustrative of the preferred embodiment, other designs could be selected without departing from the spirit and scope of the invention.

An application filed in the names of W. M. Chisholm and J. C. Dougherty on even date herewith, assigned to the assignee of record herein and assigned Ser. No. 124,683, is incorporated herein by reference thereto. An application filed in the names of W. M. Chisholm, G. S. Davis and J. C. Dougherty on even date herewith, assigned to the assignee of record herein and assigned Ser. No. 124,677, is incorporated herein by reference thereto.

What is claimed is:

1. A method of straightening pins supported in a backplane, which comprises the steps of:
  securing the backplane in a pin straightening assembly with the pins extending from the backplane and tips of the pins being fully exposed within the assembly;
  capturing the tips of the pins only within a first planar surface of the pin straightening assembly;
  providing relative reciprocating motion in a first direction between the first planar surface and the backplane to straighten the pins in the first direction;

withdrawing the tips of the pins from within the first planar surface while the backplane remains secured within the pin straightening assembly to again fully expose the tips of the pins;

capturing the tips of the pins only within a second planar surface of the pin straightening assembly which is recessed planarly from the first planar surface in a direction away from the pins to be straightened; and providing relative reciprocating motion in a second direction between the second planar surface and the backplane to straighten the pins in the second direction.

2. A method of straightening pins supported in a backplane, which comprises the steps of:

securing the backplane in a pin straightening assembly with the pins extending from the backplane and tips of the pins being fully exposed within the assembly;

capturing the tips of the pins only within a first planar surface of the pin straightening assembly;

reciprocating the first planar surface in a first direction to straighten the pins in the first direction;

withdrawing the tips of the pins from within the first planar surface while the backplane remains secured within the pin straightening assembly to again fully expose the tips of the pins;

capturing the tips of the pins only within a second planar surface of the pin straightening assembly which is recessed from the first planar surface in a direction away from the pins to be straightened; and reciprocating the backplane in a second direction to straighten the pins in the second direction.

3. The method of straightening pins as set forth in claim 2, which further comprises the steps of holding the backplane flat during the straightening of the pins.

4. The method of straightening pins as set forth in claim 2, which further comprises the step of supporting the backplane in a position to expose the pins while the backplane and pins are located in a pin straightening apparatus except during the straightening of the pins.

5. A method of straightening pins as set forth in claim 2, which further comprises the step of moving the first planar surface of the pin straightening assembly to a position beyond the area immediately above the pins when the pin tips are captured within the second planar surface of the pin straightening assembly.

6. A method of straightening pins supported in a backplane, which comprises the steps of:

capturing the tips of only a first group of the pins within a first planar surface of a pin straightening assembly;

reciprocating the assembly in a first plane to straighten the pins of the first group in the direction of the first plane;

capturing the tips of only a second group of the pins within the first planar surface of the assembly;

reciprocating the assembly in the first plane to straighten the pins of the second group in the direction of the first plane;

capturing the tips of only a third group of the pins, composed of some of the pins of the first and second groups, within a second planar surface of the assembly which is recessed from the first planar surface in a direction away from the pins to be straightened;

reciprocating the backplane in a second plane to straighten the pins of the third group in the direction of the second plane;

capturing the tips of only a fourth group of the pins, composed of the remaining pins of the first and second groups, within the second planar surface of the assembly; and reciprocating the backplane in the second plane to straighten the fourth group of pins in the direction of the second plane.

7. The method of straightening pins as set forth in claim 6, which further comprises the step of rigidly clamping the backplane during the straightening of the pins.

8. The method of straightening pins as set forth in claim 6, which further comprises the step of holding the backplane flat during the straightening of the pins.

9. A method of straightening pins as set forth in claim 6, which further comprises the step of moving the first planar surface of the pin straightening assembly to a position beyond the area immediately above the pins when the pin tips are captured within the second planar surface of the pin straightening assembly.

10. Apparatus for straightening pins supported in a backplane, which comprises:

means for straightening the pins in a first direction and having a pin-capturing surface located in a first plane;

means for straightening the pins in a second direction and having a pin-capturing surface located in a second plane recessed from the first plane in a direction away from the pins to be straightened;

means for holding the first-direction and second-direction straightening means for common movement;

means for supporting the backplane with the pins extending toward the commonly supported first-direction and second-direction straightening means;

means for selectively moving the holding means to:
(1) capture tips of the pins only within the first-direction straightening means;
(2) reciprocate the holding means in the plane of the first-direction straightening means while the pin tips are captured within the first-direction straightening means; and
(3) capture tips of the pins only within the second-direction straightening means; and means for selectively moving the backplane supporting means in the plane of the second-direction straightening means while the pin tips are captured within the second-direction straightening means.

11. The apparatus for straightening pins as set forth in claim 10, which further comprises means for rigidly clamping the backplane during the straightening of the pins.

12. The apparatus for straightening pins as set forth in claim 10, which further comprises means for holding the backplane flat during the straightening of the pins.

13. The apparatus for straightening pins as set forth in claim 10, which further comprises:

means for rigidly clamping the backplane during the straightening of the pins; and means for holding the backplane flat during the straightening of the pins.

14. The apparatus for straightening pins as set forth in claim 10, wherein the first direction straightening means includes a bar having at least one row of pin-receiving apertures formed in the pin-capturing surface.

15. The apparatus for straightening pins as set forth in claim 14, wherein the second-direction straightening means includes at least one bar having at least one row of pin-receiving apertures formed in the pin-capturing surface and being attached perpendicularly to one side of the bar of the first-direction straightening means.

16. The apparatus for straightening pins as set forth in claim 10, wherein the supporting means includes means for accommodating the support of the backplanes of different lengths.

17. The apparatus for straightening pins as set forth in claim 16, wherein the accommodating means comprises:
a support member having planar surfaces for supporting at least engaging portions of the surface of the backplane;
an opening formed centrally within the support member;
a pair of rails located within the opening along opposite side walls thereof; and
a slide positioned on and spanning the pair of rails for adjustable movement thereover; the slide having surfaces coplanar with the planar surfaces of the support member for supporting engaging portions of the surface of the backplane.

18. The apparatus for straightening pins as set forth in claim 17, wherein the accommodating means further includes a pair of inserts positioned over the pair of rails along the portions thereof extending between the side and a spaced opposite wall of the opening formed in the support member; the pair of inserts having surfaces coplanar with the planar surfaces of the support member for supporting engaging portions of the surface of the backplane.

19. The apparatus for straightening pins as set forth in claim 11, wherein the clamping means includes:
a fixture for supporting the backplane thereon;
a clamping cover positioned over the backplane and the fixture with at least portions of the backplane located between the fixture and the clamping cover; and
means for rigidly securing the fixture and the clamping cover together.

20. The apparatus for straightening pins as set forth in claim 19, wherein the clamping cover is formed with a nest for receiving the backplane therein while the backplane is clamped between the fixture and the clamping cover.

21. The apparatus for straightening pins as set forth in claim 12, wherein the holding means includes:
a fixture for supporting the backplane thereon in a flat support plane; and
a cover positioned over the backplane to urge the backplane into a flat planar position adjacent to the flat support plane.

22. The apparatus for straightening pins as set forth in claim 21, wherein the cover is formed with a nest for receiving the backplane therein.

23. The apparatus for straightening pins as set forth in claim 21, which further comprises means for securing the fixture and the cover together.

24. The apparatus for straightening pins as set forth in claim 19, wherein the clamping cover is formed with a plurality of apertures which are positioned about the pins during positioning of the cover over the backplane; an entry mouth of each aperture formed with a conical surface to capture pins which deviate beyond the aperture.

25. The apparatus for straightening pins as set forth in claim 21, wherein the cover is formed with a plurality of apertures which are positioned about the pins during positioning of the cover over the backplane; an entry mouth of each aperture formed with a conical surface to capture pins which deviate beyond the aperture.

* * * * *